United States Patent
Tønnes

(10) Patent No.: US 11,894,302 B2
(45) Date of Patent: Feb. 6, 2024

(54) SEMICONDUCTOR POWER MODULE WITH BUSBAR HAVING A LEG WITH A FOOT FORMING AN OFFSET ANGLE, AND METHOD FOR MANUFACTURING THE BUSBAR

(71) Applicant: Danfoss Silicon Power GmbH, Flensburg (DE)

(72) Inventor: Michael Tønnes, Nordborg (DK)

(73) Assignee: Danfoss Silicon Power GmbH, Flensburg (DE)

( * ) Notice: Subject to any disclaimer, the term of this patent is extended or adjusted under 35 U.S.C. 154(b) by 0 days.

(21) Appl. No.: 16/982,911

(22) PCT Filed: Mar. 18, 2019

(86) PCT No.: PCT/EP2019/056729
§ 371 (c)(1),
(2) Date: Sep. 21, 2020

(87) PCT Pub. No.: WO2019/179955
PCT Pub. Date: Sep. 26, 2019

(65) Prior Publication Data
US 2021/0013148 A1     Jan. 14, 2021

(30) Foreign Application Priority Data
Mar. 22, 2018 (DE) .......................... 102018204408.2

(51) Int. Cl.
*H01L 23/528*     (2006.01)
*H01L 23/13*     (2006.01)
*H01L 25/07*     (2006.01)

(52) U.S. Cl.
CPC .......... *H01L 23/5286* (2013.01); *H01L 23/13* (2013.01); *H01L 25/072* (2013.01); *H01L 2224/40137* (2013.01)

(58) Field of Classification Search
CPC ... H01L 23/5286; H01L 23/13; H01L 25/072; H01L 25/18; H01L 23/49811
(Continued)

(56) References Cited

U.S. PATENT DOCUMENTS 5,243,217 A     9/1993    Yamada
5,293,142 A *   3/1994    Fello .................... H01H 83/144
                                                                     361/42
(Continued)

FOREIGN PATENT DOCUMENTS

DE    10 2012 224 356 A1    11/2013
DE    202013105809 U1    1/2014
(Continued)

OTHER PUBLICATIONS

International Search Report for PCT Serial No. PCT/EP2019/056729 dated Jun. 11, 2019.

*Primary Examiner* — Quoc D Hoang
(74) *Attorney, Agent, or Firm* — McCormick, Paulding & Huber PLLC

(57) ABSTRACT

A conducting busbar (2, 4) suitable for use in a semiconductor power module (8) is provided. The busbar (2, 4) comprises a main plate (210, 410), one or more legs (220, 420) extending from the main plate (210, 410), and one or more feet (230, 430) formed at the free end of the legs (220, 420). According to the invention, the intersection line (L) between at least one of the legs (220, 420) and the associated foot (230, 430) forms an offset angle (α) with respect to the longitudinal direction (X) of the main plate (210, 410).

21 Claims, 7 Drawing Sheets

(58) Field of Classification Search
USPC .......................................................... 257/207
See application file for complete search history.

(56) References Cited

U.S. PATENT DOCUMENTS

| | | | |
|---|---|---|---|
| 6,262,474 B1 | 7/2001 | Kobayashi et al. | |
| 8,405,206 B1 | 3/2013 | Duetemeyer et al. | |
| 10,522,482 B2 | 12/2019 | Kitajima et al. | |
| 10,714,447 B2 | 7/2020 | Yoneyama et al. | |
| 2007/0284706 A1* | 12/2007 | Cherian | H01L 24/13 |
| | | | 257/666 |
| 2011/0186999 A1 | 8/2011 | Fumihiko et al. | |
| 2013/0017436 A1* | 1/2013 | Kume | H01M 50/502 |
| | | | 429/159 |
| 2015/0256096 A1* | 9/2015 | Nishizawa | B60L 50/61 |
| | | | 361/306.1 |
| 2018/0122715 A1 | 5/2018 | Kodaira | |

FOREIGN PATENT DOCUMENTS

| | | |
|---|---|---|
| JP | S60119767 A | 6/1985 |
| JP | 6116452 B2 | 4/2017 |
| WO | 2017122473 A1 | 7/2017 |

\* cited by examiner

SEMICONDUCTOR POWER MODULE WITH BUSBAR HAVING A LEG WITH A FOOT FORMING AN OFFSET ANGLE, AND METHOD FOR MANUFACTURING THE BUSBAR

CROSS-REFERENCE TO RELATED APPLICATIONS

This application is a National Stage application of International Patent Application No. PCT/EP2019/056729, filed on Mar. 18, 2019, which claims priority to German Patent Application No. 102018204408.2 filed on Mar. 22, 2018, each of which is hereby incorporated by reference in its entirety.

TECHNICAL FIELD

The present invention relates to the field of semiconductor power modules, in particular to a busbar to be used in such power modules.

BACKGROUND

Semiconductor power modules, which comprise one or more semiconductor switches such as IGBTs, MOSFETs or other power controlling semiconductors, are connected to power inputs, power outputs, and one or more control connectors through which the switching of the semiconductors is controlled. The package of the power modules is completed by some form of housing which protects the electrical circuit and components from the environment.

A typical power module comprises a baseplate on which is mounted a substrate such as a direct bonded copper substrate (DBC). On the top side of this substrate may be printed or etched a circuit pattern, on which are mounted components such as power semiconductors. In certain high power devices it is convenient to use a busbar structure to conduct a current in or out of the module, between the external contacts and the connection points on the substrate.

Often, such busbar structures may be formed by stamping or cutting from a flat sheet of a conductive metal such as copper, and then bending into a structure which can conduct current between the external contacts and the appropriate points on the substrate. Often, such a structure has legs and feet, the legs connecting an upper platelike structure of the busbar down to the level of the substrate, and the feet forming a connection area parallel to the substrate. These feet are used to realize a low electrical resistance connection to the substrate by, for example, soldering, sintering or ultrasonic welding.

In service, such modules will be subject to varying electrical loads and the components mounted on the substrate will generate heat. Whilst most of this heat is, in general, conducted away, the temperature of the substrate and of the connected busbar will vary. A problem occurs because the thermal expansion of the substrate and that of the busbar can be very different, due to the fact that their coefficients of thermal expansion (CTEs) are different. Substrates are often a laminated structure with a ceramic core and electrically conducting thin layers on each side. Busbars, on the other hand, are either solid copper, or a laminated structure with several layers of copper connected by insulating films. A typical CTE of a substrate is $7\times10^{-6}/°$ C., and that of a copper plate $16\times10^{-6}/°$ C.

This difference in coefficients of thermal expansion causes a difference in linear expansion between the substrate and the busbar. This in turn leads to stresses at the point of connection between the busbar feet and the substrate. The stresses can in turn cause cracking at this interface and eventually lead to a disconnection. This process severely restricts the reliability of such a construction, and is a great disadvantage.

SUMMARY

Therefore, an object of the present invention is to provide a busbar, a method for manufacturing the same and a power module comprising the same which can overcome or at least alleviate the above-mentioned deficiencies.

This object is solved by a busbar according with features according to claim 1, a power module with the features according to claim 8 and a method for forming such a busbar with the features according to claim 9. Further embodiments are defined in the dependent claims.

According to an aspect of the present invention, there is provided a conducting busbar suitable for use in a semiconductor power module, comprising a main plate, one or more legs extending from the main plate, and one or more feet formed at the free end of the legs, wherein the intersection line between at least one of the legs and the associated foot forms an offset angle with respect to the longitudinal direction of the main plate. As used herein, a "conducting busbar" shall mean an electrically conducting busbar.

In some embodiments, at least one of the legs of the busbar according to the present invention comprises a twisted section through which the plane of the leg is rotated by an offset angle. By this way, the associated foot is also rotated by an offset angle with respect to the situation where the leg and the foot are formed by simple cutting and bending of a flat metal sheet.

In some embodiments, the offset angle formed by the intersection line between the at least one of the legs and the associated foot with respect to the longitudinal direction of the main plate may be from 3° up to 180°, for example 5°, 10°, 15°, 30°, 45°, 60°, 75°, 90°, 105°, 120°, 135°, 150°, 165°, or 180°.

In some embodiments, each leg of the busbar according to the present invention comprises a twisted section through which the plane of the leg is rotated by an offset angle. In this case, it is preferable that all the legs are twisted in the same way, for example through the same angle and in the same direction.

In some embodiments, the legs of the busbar according to the present invention extend from two opposite sides of the main plate of the busbar, preferably the two longitudinal sides. In this case, the legs on the two opposite sides of the main plate of the busbar may be arranged symmetrically. In other embodiments, the legs of the busbar according to the present invention extend from one side of the main plate of the busbar, preferably a longitudinal side.

According to another aspect of the present invention, there is provided a busbar system comprising two or more busbars according to the present invention, wherein the busbars are in close proximity with an air gap or an insulating film or layer between them.

According to another aspect of the present invention, there is provided a power module including an above-defined busbar or busbar system.

According to a further aspect of the present invention, there is provided a method for forming a busbar according to the present invention, comprising the steps of:

stamping or cutting a planar structure with a main plate and at least one leg out of an electrical conducting sheet;

bending the at least one leg out of the plane of the main plate, and bending the end section of the at least one leg to form a foot; and twisting the at least one leg in such a way that the intersection line between the at least one leg and the associated foot forms an offset angle with respect to the longitudinal direction of the main plate.

BRIEF DESCRIPTION OF THE DRAWINGS

These and other aspects and advantages of the present invention will become more obvious and understandable from the following description of the preferred examples with reference to the drawings, wherein.

DETAILED DESCRIPTION

Figure 1:
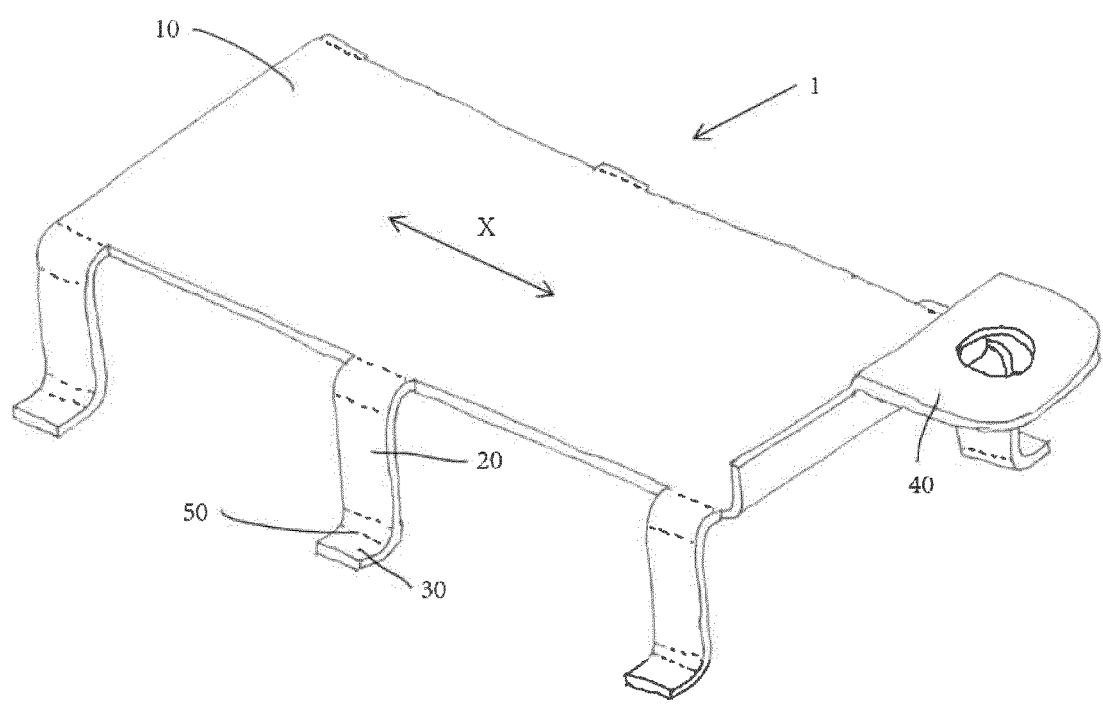
FIG. 1 is a perspective view of a single layer metallic busbar, which is known in prior art.

Technical solutions of the present invention will be described hereinafter in more detail by the way of embodiment with reference to FIGS. 1-11. The description of the embodiments of the present invention with reference to the accompanying drawings is intended to interpret the general inventive concept of the present invention, and shall not be construed as limiting to the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As used herein, the "intersection line" between a leg and a foot shall mean the intersection line of the plane in which the foot resides and the tangent plane of the leg at its free end. In case where the leg is flat and planar, the tangent plane of the leg is the plane in which the leg resides. In some cases, the "intersection line" between a leg and a foot is also the line at which the foot and the leg converge or the line at which the leg is connected to the substrate.

As used herein, the "free end" of a leg shall mean the end of the leg other than the one at which the leg is connected to the main plate of the busbar.

As used herein, the "longitudinal direction" of a main plate shall mean the direction of the main plate with the greatest extension. In most cases where the main plate is of a generally rectangle shape, the longitudinal direction is the direction of the long sides of the rectangle, along which one or two rows of legs are arranged.

FIG. 1 shows a typical single layer metallic busbar 1 with six legs 20 and six feet 30 and one external connector 40, which is common in the art. The busbar 1 includes a main plate 10 of a rectangle form, six legs 20 (only four of which are shown in the figure) extending from the two opposite sides of the main plate 10, and an external connector 40 extending from one of the rest sides of the main plate 10. Each leg 20 terminates at its free end with a foot 30. The six legs 20 extend in directions transverse to the face of the main plate 10, and each foot 30 extends in a direction transverse to the extending direction of the corresponding leg 20. The intersection line 50 between the leg 20 and the associated foot 30 is parallel to the longitudinal direction X of the main plate. The busbar 1 is formed by stamping and bending from a sheet of metal such as copper, aluminium or other relatively low electrical resistance metal.

As the temperature of the busbar 1 rises the greatest linear expansion will be along the length of this structure, that is the longitudinal direction X, since the linear extent is greater. Since the substrate (not shown in FIG. 1), which has a lower CTE, will not expand as much, a mismatch between the expansion of the busbar 1 and the expansion of the substrate will result in a stress at the foot 30 of each leg 20 of the busbar 1. The stress can in turn cause cracking at these interfaces and eventually lead to a disconnection.

Figure 2:
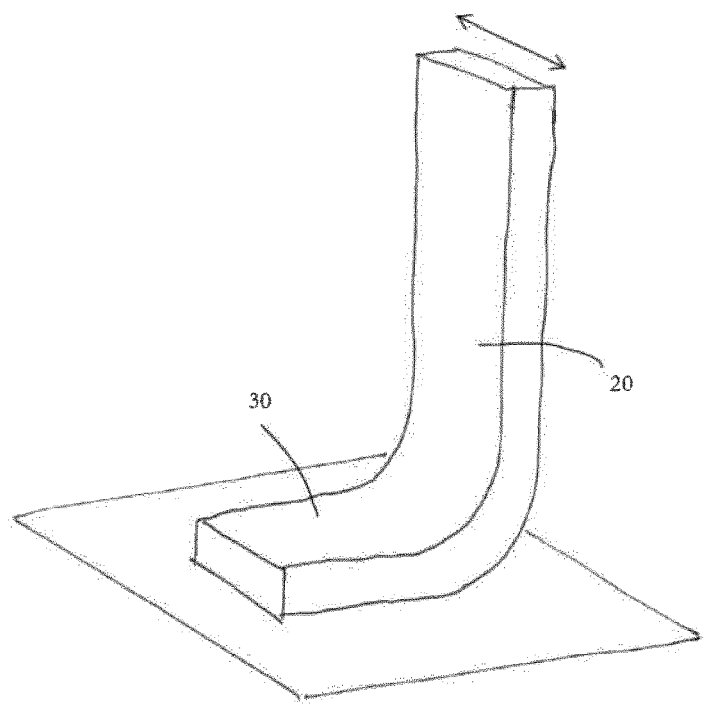
FIG. 2 shows a detail of one of the feet of the busbar from FIG. 1, connected to the electrical contact of the substrate.

FIG. 2 shows a detail of one of the feet of the busbar from FIG. 1, connected to the electrical contact of the substrate. As shown, the foot 30 is formed by bending the end of the leg 20, and extends in a direction transverse to the extending direction of the leg 20. The expansion of the busbar results in a movement relative to the substrate in the direction shown by the arrow. It has been found, in particular model, that in this situation a 30 μm displacement at the top end of the leg 20 results in stress of 65-70 MPa at the interface with the surface of the substrate.

Figure 3:
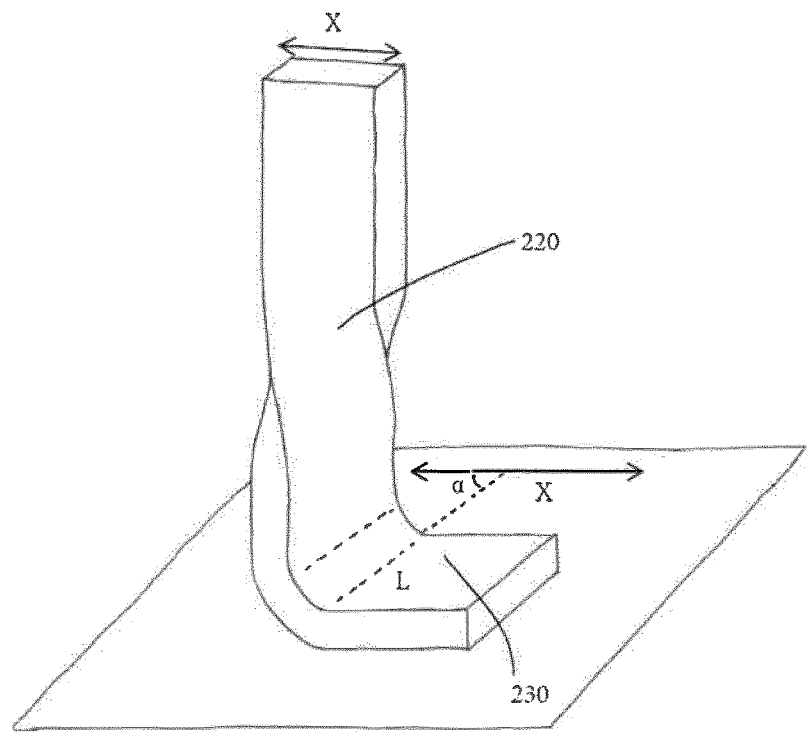
FIG. 3 is a similar view of a foot of a busbar according to the present invention, with the leg twisted by approximately 90° in comparison with that shown in FIG. 2.

FIG. 3 is a view of a foot 230 of a busbar according to the present invention, with the leg 220 twisted by approximately 90° in comparison with that shown in FIG. 2. Thus, the foot 230 is correspondingly rotated by approximately 90° with respect to that shown in FIG. 2. As shown in the figure, the intersection line L between the leg 220 and the foot 230 forms an offset angle α with respect to the longitudinal direction X of the main plate (not shown in this figure). By a modelling similar to FIG. 2 performed on this structure, it is found that a 30 μm displacement at the top end of the leg 220 results in a 25-30 MPa at the interface with the surface of the substrate.

Thus, a significant reduction of the stresses that occur at the interface has been brought about by the rotation of the foot 230. This is because some of the movement caused by the expansion of the busbar relative to the substrate has been taken up in the twisted structure of the leg 220.

Figure 4:
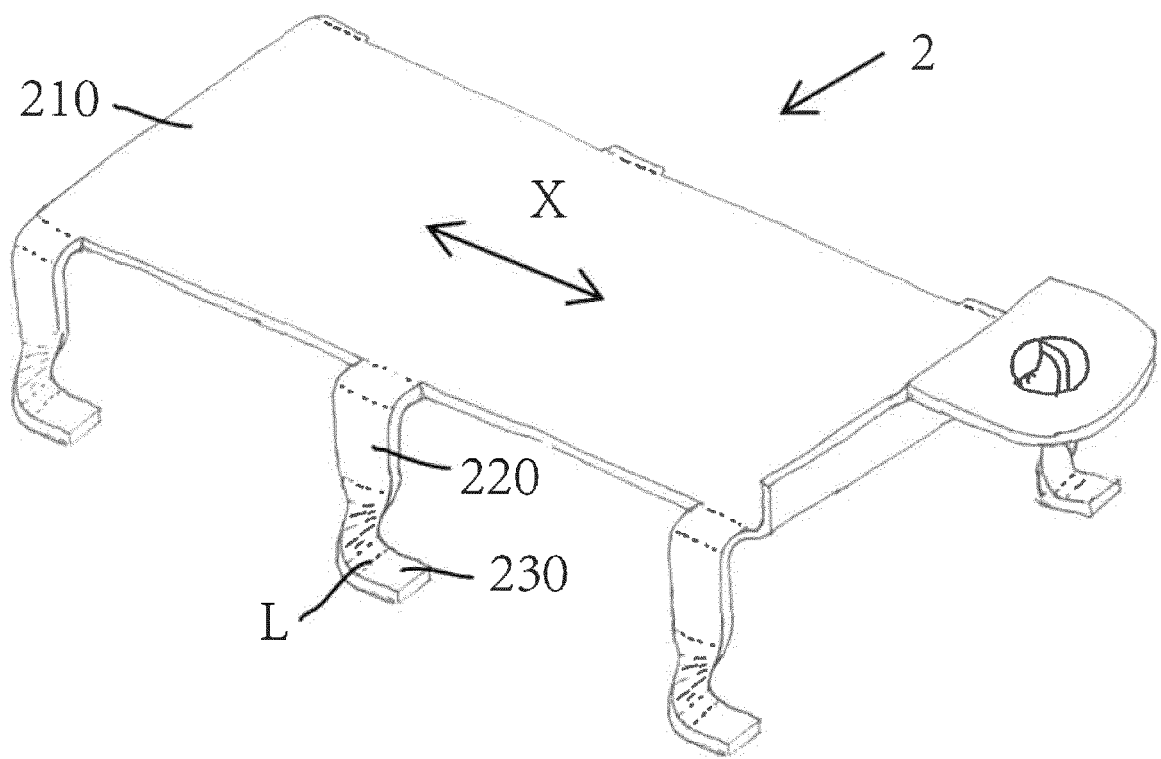
FIG. 4 is a perspective view of a busbar, similar to that shown in FIG. 1, with the legs twisted by approximately 90° in comparison with that shown in FIG. 1.

FIG. 4 is a perspective view of a busbar 2 according to the present invention, similar to that shown in FIG. 1, with the legs 220 twisted by approximately 90° in comparison with that shown in FIG. 1. All of the six feet 230 (only four of which are shown in the figure) are correspondingly rotated in the same direction by approximately 90° with respect to that shown in FIG. 2. Of course, the rotated feet 230 shall be in such positions and orientations as to guarantee a proper contact between the busbar 2 and the substrate. In this case, the intersection line L between the leg 220 and the associated foot 230 forms an offset angle of approximately 90° with respect to the longitudinal direction X of the main plate 210.

Figure 5:
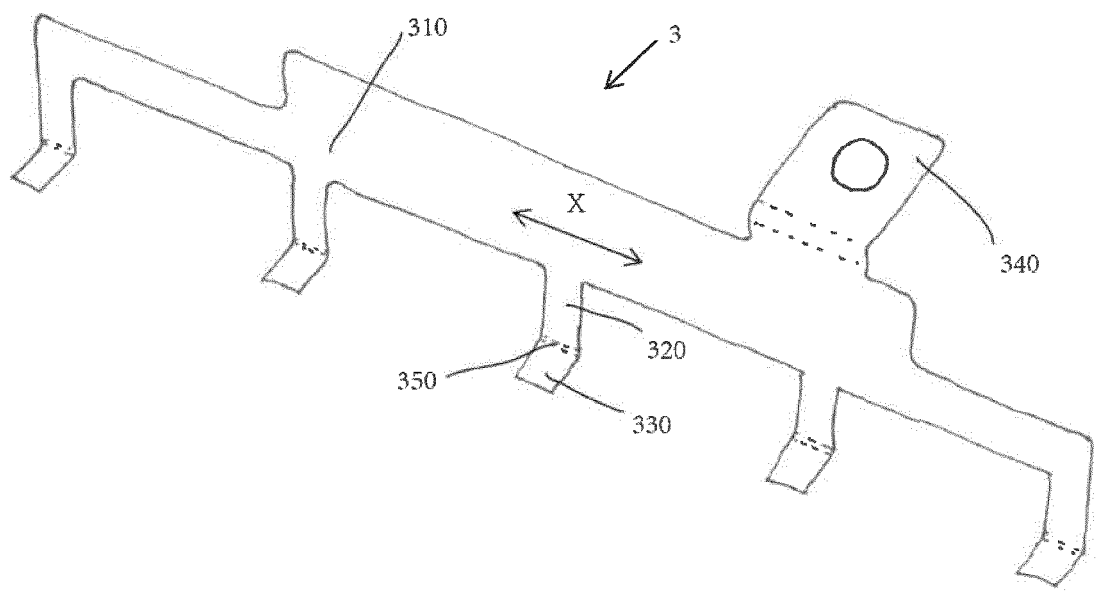
FIG. 5 is a perspective view of an alternative form of busbar, which is known in the field.

FIG. 5 shows an alternative form of single layer metallic busbar 3 with five legs 320 and five feet 330 and one external connector 340, which is known in the art. The busbar 3 includes an elongated main plate 310 of a strip form, five legs 320 extending from a long side of the main plate 310, and an external connector 340 extending from the other long side of the main plate 310. Each leg 320 terminates at its free end with a foot 330. The five legs 320 extend in directions transverse to the longitudinal direction of the main plate 310, and each foot 330 extends in direction transverse to the extending direction of the corresponding leg 320. The intersection line 350 between the leg 320 and the associated foot 330 is parallel to the longitudinal direction X of the main plate 310. Again, the busbar 3 is formed by stamping and bending from a sheet of metal such as copper, aluminium or other relatively low electrical resistance metal.

Figure 6:
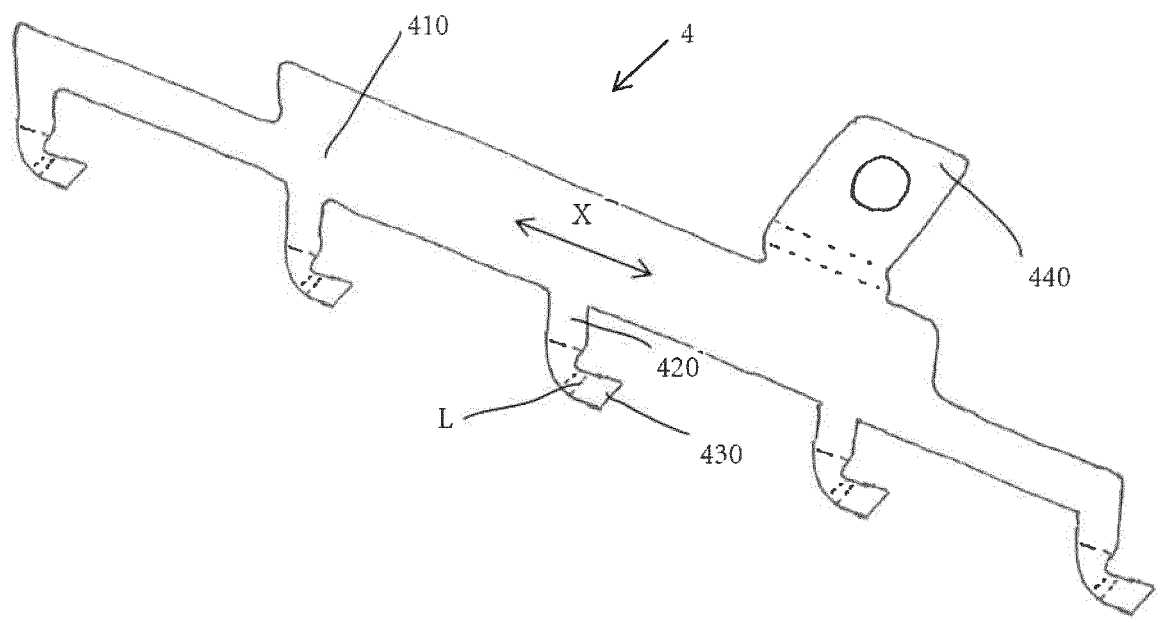
FIG. 6 is a perspective view of a busbar, similar to that shown in FIG. 5, with the legs twisted by approximately 90° in comparison with that shown in FIG. 5.

FIG. 6 is a perspective view of a busbar 4 according to the present invention, similar to that shown in FIG. 5, with the legs 420 twisted by approximately 90° in comparison with that shown in FIG. 5. All of the five feet 430 are correspondingly rotated in the same direction by approximately 90° with respect to that shown in FIG. 5. Of course, the rotated feet 430 shall be in such positions and orientations as to guarantee a proper contact between the busbar 4 and the substrate. In this case, the intersection line L between the leg 420 and the associated foot 430 forms an offset angle of approximately 90° with respect to the longitudinal direction X of the main plate.

Figure 7:
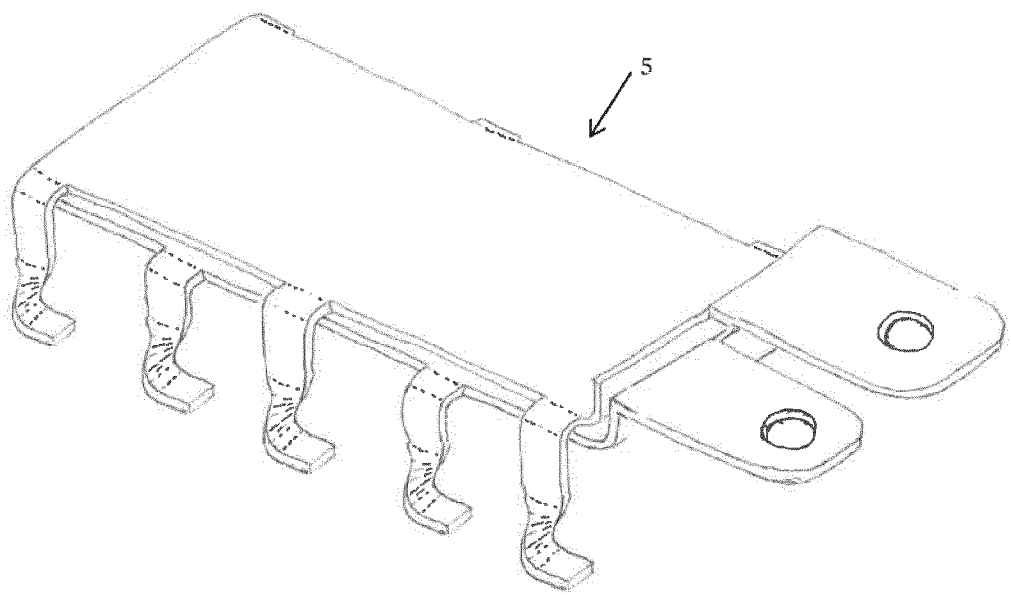
FIG. 7 is a perspective view of a two-layer busbar system formed from two busbars which are similar to that shown in FIG. 4 and having rotated feet.

FIG. 7 is a perspective view of a two-layer busbar structure 5 formed from two busbars which are similar to that shown in FIG. 4 and having rotated feet. Three legs of the upper busbar and two legs of the lower busbar are visible. All of the five feet are rotated in the same direction by approximately 90° with respect to the feet otherwise formed by simply bending the end section of the respective legs.

It is often advantageous to form a multiple-layer busbar structure, for example for positive, negative and AC conductors for a power converter module. The multiple-layer busbar structure 5 shown in FIG. 7 may be formed by placing two single-layer busbars in close proximity with an air gap or an insulating film between them, or by laminating two plate-like busbars solidly together with an epoxy or thermoplastic insulating material arranged therebetween. The more solid the busbar structure becomes, the more severe the problem of disconnection due to thermal stresses at the feet becomes, since the busbar structure itself is unable to bend in such situations.

Figure 8:
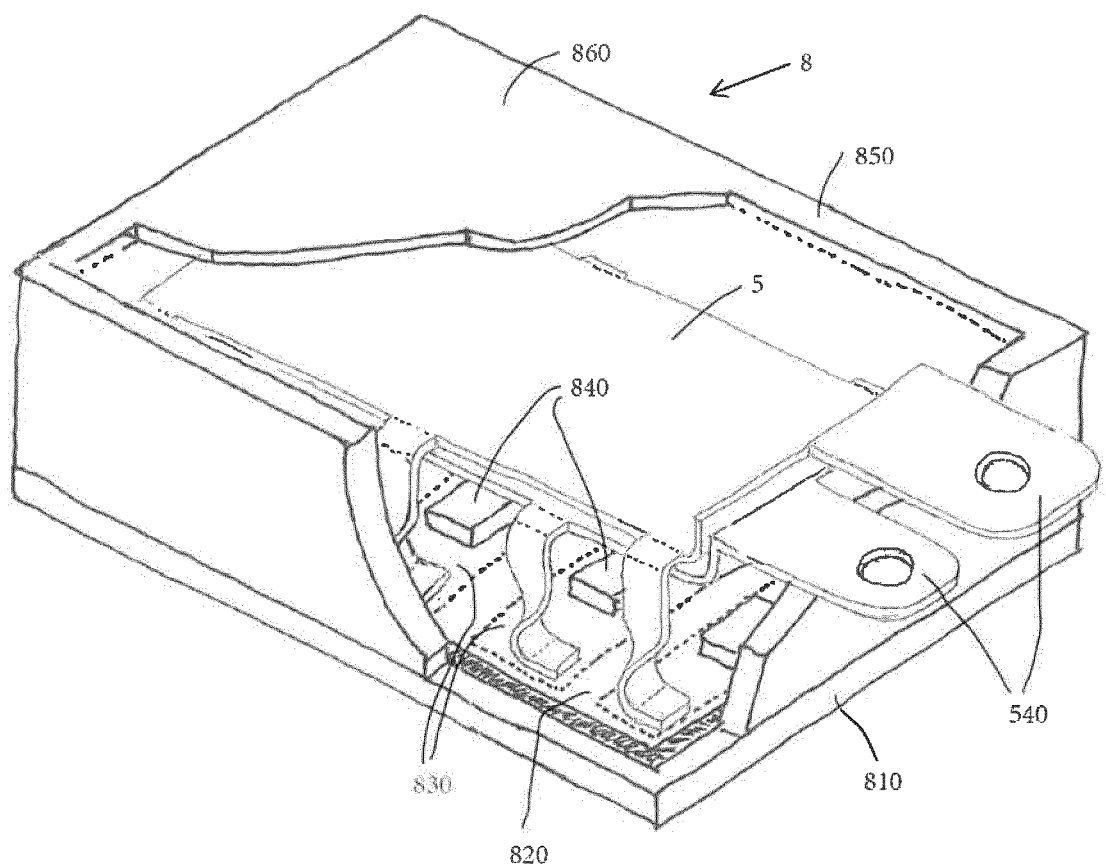
FIG. 8 is a partially cut-away perspective view of a power module, with the two-layer busbar system of FIG. 7 assembled therein.

FIG. 8 is a partially cut-away perspective view of a power module 8, with the two-layer busbar system 5 of FIG. 7 assembled therein. This power module 8 comprises a baseplate 810 on which a DBC substrate 820 is placed which exhibits (electrically conducting) tracks 830 on its top surface on which semiconductors 840 are mounted. There may also be additional wiring connecting semiconductors such as wirebonds, which are not shown in the figure. A two-layer busbar system 5 with rotated feet and two external connectors 540 is connected to the tracks 830 on the DBC substrate 820. A frame 850, through which the external connectors 540 protrude, is assembled on top of the baseplate 810 and surrounds the DBC 820, semiconductors 840 and the busbar system 5. A lid 860 on the top of the frame 850 closes the power module 8.

Figure 9:
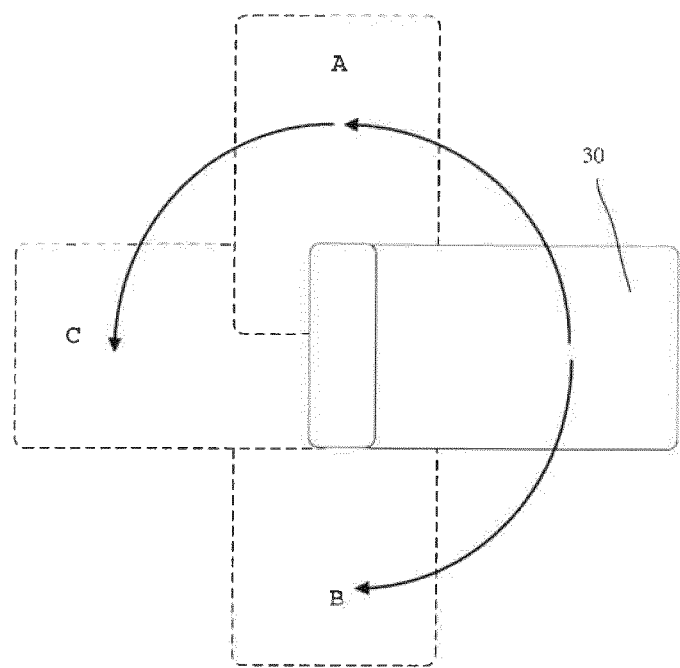
FIG. 9 is a plan view looking down on a leg structure and illustrating three possible positions of a rotated foot.
Figure 10:
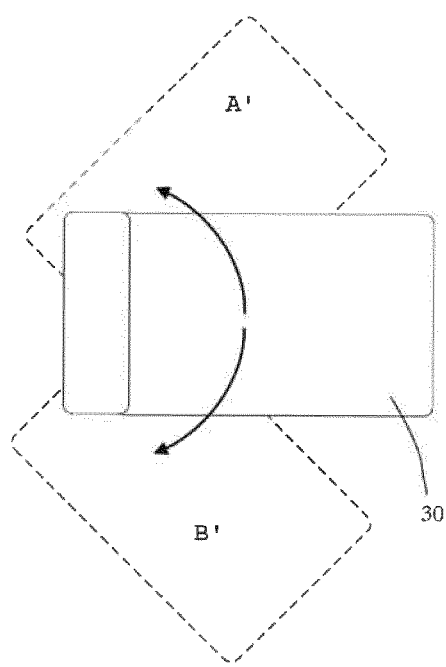
FIG. 10 is a plan view looking down on a leg structure and illustrating two possible positions of a rotated foot.

FIG. 9 is a plan view looking down on a leg structure and illustrating three possible positions of a rotated foot 30, and FIG. 10 is a plan view looking down on a leg structure and illustrating two possible positions of a rotated foot 30. Position A and position B shown in FIG. 9 represent rotations from the original position by 90°. Position C shown in FIG. 9 represents a rotation by 180°. Such rotations need not be restricted to integer multiples of 90°. For example, FIG. 10 shows two possible rotations (positions A' and B') of less than 90°, for example 45°.

Figure 11:
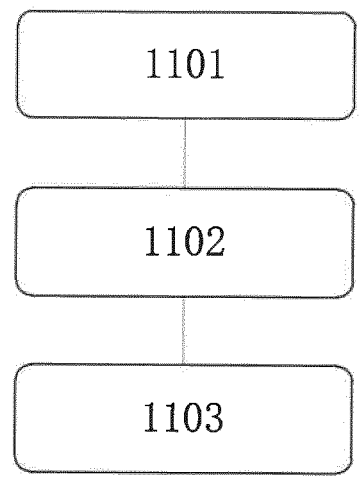
FIG. 11 is a flow chart showing the steps of the method for forming a busbar according to the present invention.

FIG. 11 is a flow chart showing the steps of the method for forming a busbar according to the present invention. A planar structure with a main plate and at least one leg is firstly stamped or cut 1101 out of an electrical conducting sheet. Then the at least one leg is bent 1102 out of the plane of the main plate, and the end section of the at least one leg is bent to form a foot. Subsequently, the at least one leg is twisted 1103 in such a way that the intersection line between the at least one leg and the associated foot forms an offset angle with respect to the longitudinal direction of the main plate. It is to be understood that the order of the last two steps can be reversed. Further, it is possible to form the foot by bending the end section of the leg before bending the leg out of the plane of the main plate.

Busbars as illustrated in FIGS. 1 and 5 are normally made by stamping or cutting a shape from a flat sheet, and then bending it to form the legs, the feet and the external contacts. Such structures could also be made by additive manufacturing techniques, by casting or by any other known technology suitable for this purpose. The forming of the twist in the leg could be made by a reasonably simple extension of casting or additive manufacture, but it could also be made by a physical twisting of the flat sheet of the busbar discussed above.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features.

What is claimed is:
1. A semiconductor power module comprising:
a substrate comprising a circuit pattern; and
a conducting busbar, the busbar comprising:
   a main plate,
   one or more legs extending from the main plate, each extending in a direction out of a plane of the main plate, and
   one or more feet formed at a free end of the legs,
wherein an intersection line between at least one of the legs and the associated foot forms an offset angle with respect to a longitudinal direction of the main plate, and wherein at least one or more feet formed at the free end of the legs form a point of connection with the circuit pattern of the substrate.

2. The semiconductor power module of claim 1, wherein at least one of the legs of the busbar comprises a twisted section through which a plane of the leg is rotated by the offset angle.

3. The semiconductor power module of claim 2, wherein each leg of the busbar comprises a twisted section through which the plane of the leg is rotated by an offset angle.

4. The semiconductor power module of claim 3, wherein all the legs are twisted through the same angle and in the same direction.

5. The semiconductor power module of claim 3 further comprising a second conducting busbar, the second conducting busbar comprising a main plate, one or more legs extending from the main plate, each extending in a direction out of a plane of the main plate, and one or more feet formed at a free end of the legs, wherein an intersection line between at least one of the legs and the associated foot forms an offset angle with respect to a longitudinal direction of the main plate,
wherein the busbars are in close proximity with an air gap or an insulating film or layer between them.

6. The semiconductor power module of claim 2, wherein the legs of the busbar extend from one side or two opposite sides of the main plate of the busbar, in particular the two longitudinal sides.

7. The semiconductor power module of claim 2, further comprising a second conducting busbar, the second conducting busbar comprising a main plate, one or more legs extending from the main plate, each extending in a direction out of a plane of the main plate, and one or more feet formed at a free end of the legs, wherein an intersection line between at least one of the legs and the associated foot forms an offset angle with respect to a longitudinal direction of the main plate,
wherein the busbars are in close proximity with an air gap or an insulating film or layer between them.

8. The semiconductor power module of claim 1, wherein the offset angle formed by the intersection line between the at least one of the legs and the associated foot with respect to the longitudinal direction of the main plate is from 3° up to 180°.

9. The semiconductor power module of claim 8, wherein the legs of the busbar extend from one side or two opposite sides of the main plate of the busbar, in particular the two longitudinal sides.

10. The semiconductor power module of claim 8 further comprising a second conducting busbar, the second conducting busbar comprising a main plate, one or more legs extending from the main plate, each extending in a direction out of a plane of the main plate, and one or more feet formed at a free end of the legs, wherein an intersection line between at least one of the legs and the associated foot forms an offset angle with respect to a longitudinal direction of the main plate,
wherein the busbars are in close proximity with an air gap or an insulating film or layer between them.

11. The semiconductor power module of claim 8, wherein the offset angle formed by the intersection line between the at least one of the legs and the associated foot with respect to the longitudinal direction of the main plate is from 45° to 135°.

12. The semiconductor power module of claim 8, wherein the offset angle formed by the intersection line between the at least one of the legs and the associated foot with respect to the longitudinal direction of the main plate is approximately 90°.

13. The semiconductor power module of claim 1, wherein the legs of the busbar extend from one side or two opposite sides of the main plate of the busbar, in particular the two longitudinal sides.

14. The semiconductor power module of claim 1, further comprising a second conducting busbar, the second conducting busbar comprising a main plate, one or more legs extending from the main plate, each extending in a direction out of a plane of the main plate, and one or more feet formed at a free end of the legs, wherein an intersection line between at least one of the legs and the associated foot forms an offset angle with respect to a longitudinal direction of the main plate,
wherein the busbars are in close proximity with an air gap or an insulating film or layer between them.

15. The semiconductor power module of claim 1, further comprising a baseplate.

16. The semiconductor power module claim 1, further comprising semiconductors.

17. The semiconductor power module of claim 1, further comprising tracks connecting external connectors.

18. The semiconductor power module of claim 1, further comprising semiconductor switches.

19. The semiconductor power module of claim 1, further comprising semiconductors mounted on the circuit pattern.

20. The semiconductor power module of claim 1, wherein the substrate is a direct bonded copper substrate.

21. A method for forming a conducting busbar, comprising the steps of:
stamping or cutting a planar structure with a main plate and at least one leg out of an electrical conducting sheet;
bending the at least one leg out of the plane of a main plate, and bending an end section of the at least one leg to form a foot; and
twisting the at least one leg in such a way that an intersection line between the at least one leg and the associated foot forms an offset angle with respect to a longitudinal direction of the main plate.

* * * * *